(12) United States Patent
Oh et al.

(10) Patent No.: US 10,586,897 B2
(45) Date of Patent: Mar. 10, 2020

(54) LED PACKAGE

(71) Applicant: LUMENS CO., LTD., Yongin-si, Gyeonggi-do (KR)

(72) Inventors: Seunghyun Oh, Yongin-si (KR); Sungsik Jo, Yongin-si (KR); Byeonggeon Kim, Yongin-si (KR)

(73) Assignee: LUMENS CO., LTD., Yongin-si (KR)

( * ) Notice: Subject to any disclaimer, the term of this patent is extended or adjusted under 35 U.S.C. 154(b) by 0 days.

(21) Appl. No.: 16/162,745

(22) Filed: Oct. 17, 2018

(65) Prior Publication Data

US 2019/0140147 A1 May 9, 2019

(30) Foreign Application Priority Data

Nov. 6, 2017 (KR) .................. 10-2017-0146590

(51) Int. Cl.
| | |
|---|---|
| *H01L 33/50* | (2010.01) |
| *H01L 33/64* | (2010.01) |
| *H01L 33/60* | (2010.01) |
| *H01L 33/48* | (2010.01) |

(52) U.S. Cl.
CPC .......... *H01L 33/502* (2013.01); *H01L 33/486* (2013.01); *H01L 33/505* (2013.01); *H01L 33/60* (2013.01); *H01L 33/641* (2013.01); *H01L 33/642* (2013.01); *H01L 33/644* (2013.01)

(58) Field of Classification Search
CPC ....................... H01L 33/64–644; H01L 33/505
See application file for complete search history.

(56) References Cited

U.S. PATENT DOCUMENTS

| | | | | |
|---|---|---|---|---|
| 2004/0256706 | A1* | 12/2004 | Nakashima | ............. H01L 33/62 257/678 |
| 2014/0021503 | A1* | 1/2014 | Yoshida | ................ H01L 33/507 257/98 |
| 2015/0163958 | A1* | 6/2015 | Oguma | .............. H05K 7/20463 264/36.22 |
| 2016/0190418 | A1* | 6/2016 | Inomata | ................ H01L 33/644 257/98 |

FOREIGN PATENT DOCUMENTS

| | | |
|---|---|---|
| JP | 59-206869 A | 11/1984 |
| JP | 8-122769 A | 5/1996 |
| JP | 2009-71005 A | 4/2009 |
| JP | 2009-258455 A | 11/2009 |
| JP | 2011-075825 A | 4/2011 |
| WO | 2012/132232 A1 | 10/2012 |
| WO | 2015/020205 A1 | 2/2015 |
| WO | 2015/190241 A1 | 12/2015 |
| WO | 2015/194297 A1 | 12/2015 |

* cited by examiner

*Primary Examiner* — Jamie C Niesz
(74) *Attorney, Agent, or Firm* — Mei & Mark LLP

(57) ABSTRACT

An LED package is disclosed. The LED package includes: a metal reflector having a cavity formed therein; an LED chip arranged on the bottom of the cavity of the reflector; a wavelength converting panel including a lower glass plate, an upper glass plate, and a wavelength converting sheet interposed between the lower glass plate and the upper glass plate and arranged on the cavity of the reflector; and a sealing member disposed on the side surface of the lower glass plate and the side surface of the upper glass plate and connecting the wavelength converting panel to the reflector.

20 Claims, 3 Drawing Sheets

LED PACKAGE

BACKGROUND OF THE INVENTION

1. Field of the Invention

The present invention relates to an LED package, and more specifically to an LED package including a wavelength converting panel.

2. Description of the Related Art

A number of types of materials capable of converting the wavelength of light from LEDs are used to utilize the LEDs in various applications, including display or lighting. Phosphors have been used as wavelength converting materials and the use of quantum dots (QDs) capable of emitting light at different wavelengths depending on their size or shape has been steadily on the rise. For use of QDs as wavelength converting materials of LEDs, a mixture of QDs with a polymer is generally processed into a sheet. QDs or moisture-susceptible phosphors need to be protected. To this end, several protective layers are formed on the surface of a QD or phosphor sheet. However, repeated coating for the formation of the protective layers leads to an increase in production cost and is limited in protecting the QDs or phosphor from moisture. The heat-susceptible QD or phosphor sheet is arranged adjacent to an LED releasing a large amount of heat. This arrangement causes damage to the QD or phosphor sheet. In an attempt to solve this problem, a proposal has been made to use a QD or phosphor sheet interposed between a pair of glass plates. According to this proposal, however, the gap between the pair of glass plates is sealed, and as a result, heat generated during operation of an LED is transferred to the QDs or phosphor but is not released from the space defined by the pair of glass plates to the outside, causing poor reliability. For this reason, the prior art is difficult to apply to an LED package in which a space accommodating an LED is completely sealed, impeding the release of heat. Thus, previous large-area QD sheets have been difficult to apply to local regions of packages. On the other hand, many chip scale package (CSP) type LED packages are currently used. However, existing CSP type LED packages suffer from the problem that a considerable amount of light emitted from an LED chip is lost without being extracted to the outside. LED packages based on QDs are also difficult to realize.

SUMMARY OF THE INVENTION

The present invention intends to provide an LED package including a wavelength converting material in the form of a sheet including QDs or phosphor particles susceptible to moisture or heat and constructed such that the wavelength converting material can be protected from heat generated during operation of an LED chip or moisture.

An LED package according to one aspect of the present invention includes: a metal reflector having a cavity formed therein; an LED chip arranged on the bottom of the cavity of the reflector; a wavelength converting panel including a lower glass plate, an upper glass plate, and a wavelength converting sheet interposed between the lower glass plate and the upper glass plate and arranged on the cavity of the reflector; and a sealing member disposed on the side surface of the lower glass plate and the side surface of the upper glass plate and connecting the wavelength converting panel to the reflector.

According to one embodiment, the reflector includes a stepped portion formed on the inner wall surface thereof and the wavelength converting panel is supported by and in contact with the stepped portion.

According to one embodiment, the inner wall surface of the reflector includes a first stepped portion on which the wavelength converting panel is seated and a second stepped portion connected to the overlying first stepped portion and filled with the sealing member.

According to one embodiment, the wavelength converting panel includes a recess formed along the side surface of the wavelength converting sheet and depressed more inwardly than the side surface of the lower glass plate and the side surface of the upper glass plate, and a portion of the sealing member is filled in the recess.

According to one embodiment, the sealing member is formed by filling a thermally conductive metal in the form of a powder, liquid or gel in a gap between the inner wall surface of the reflector and the wavelength converting panel and solidifying the thermally conductive metal.

According to one embodiment, the LED package further includes a plating layer covering the reflector and the sealing member to integrate the reflector with the sealing member.

According to one embodiment, the wavelength converting panel further includes a recess formed along the side surface of the wavelength converting sheet and depressed more inwardly than the side surface of the lower glass plate and the side surface of the upper glass plate and a lateral sealing member located between the side surface of the wavelength converting sheet and the sealing member in the recess.

According to one embodiment, the LED chip is disposed in an inner lower space of the reflector and is integrated with the reflector by a resin part at least covering the side surface of the LED chip.

According to one embodiment, the LED chip includes a pair of electrode pads exposed downward through an opening formed at the lower end of the reflector.

According to one embodiment, the resin part is formed by filling a mixture of amorphous spherical silica and a resin into the inner lower space of the reflector and curing the mixture.

According to one embodiment, the lower wall of the reflector has a downwardly tapered inner side surface.

According to one embodiment, the wavelength converting material includes QDs.

According to one embodiment, the wavelength converting panel is horizontally arranged in the middle of the height of the reflector such that a gap is formed between the side surface of the wavelength converting panel and the inner side surface of the upper wall of the reflector, and the sealing member is formed by filling a metal in the form of a liquid, gel or powder in the gap and solidifying the metal.

According to one embodiment, the sealing member is made of a metal or metallic material.

In the LED package of the present invention, the wavelength converting sheet including a moisture- or heat-susceptible wavelength converting material (for example, one including QDs) is arranged between the glass plates with poor heat dissipation characteristics such that the wavelength converting material can be can protected from not only moisture but also heat generated during operation of the LED chip. In addition, the light extraction efficiency of the LED package according to the present invention is improved by at least 15% compared to those of existing CSP type LED packages.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE INVENTION

Preferred embodiments of the present invention will now be described with reference to the accompanying drawings.

Figure 1:
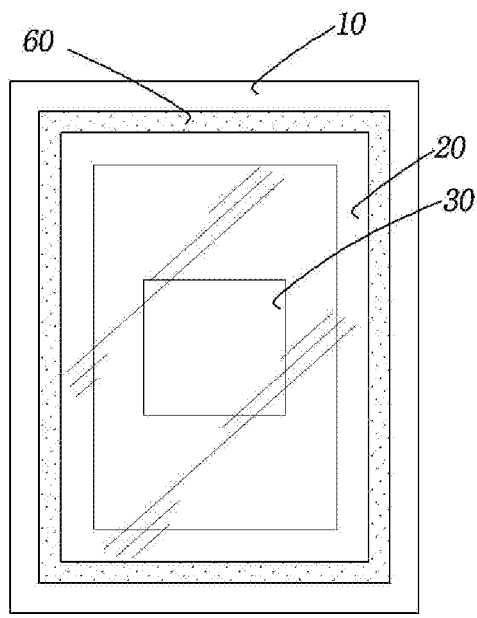
FIG. 1 is a plan view illustrating an LED package according to one embodiment of the present invention.
Figure 2:
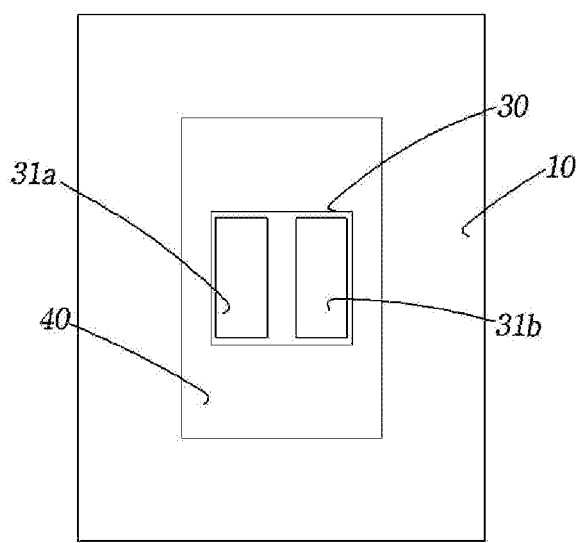
FIG. 2 is a bottom view illustrating the LED package of FIG. 1.
Figure 3:
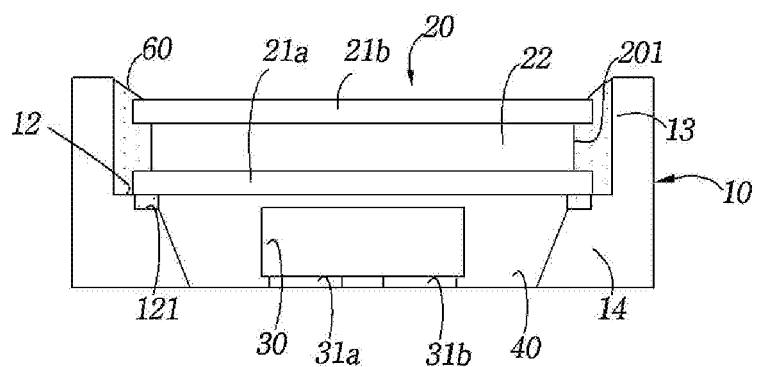
FIG. 3 is a cross-sectional view illustrating the LED package of FIGS. 1 and 2.

FIGS. 1 to 3 illustrate an LED package according to one embodiment of the present invention.

Referring to FIGS. 1 to 3, the LED package includes a metal reflector 10 having a ring-shaped stepped portion 12 (hereinafter referred to as "first stepped portion") formed in the middle of the height of the inner wall surface thereof along the inner wall surface, a wavelength converting panel 20 arranged in an inner upper space of the reflector 10 to be supported by the first stepped portion 12, an LED chip 30 accommodated in an inner lower space of the reflector 10 and located below the wavelength converting panel 20, and a resin part 40 disposed in the inner lower space of the reflector 10 to cover the side surface of the LED chip 30. The resin part 40 may have a laminate structure including a reflective resin part covering the side surface of the LED chip 30 and a light transmitting resin part disposed on the reflective resin part to cover the upper surface of the LED chip 30. The reflective resin part contains a large amount of a reflective material with respect to the resin and the light transmitting resin part contains no light reflecting material or only a small amount of a light reflecting material with respect to the resin. Alternatively, the resin part 40 may be a light transmitting part in which no light reflecting material or only a small amount of a light reflecting material is present.

The LED package includes a metal sealing member 60 closing the edge of the wavelength converting panel 20 to prevent moisture from infiltrating into an internal wavelength converting material and to thermally connect the wavelength converting panel 20 to the metal reflector 10.

The metal reflector 10 may be made of a highly thermally conductive and reflective metal, preferably nickel, chromium, silver, aluminum, gold, copper, zinc, tin, platinum or lead, or a metal material including at least one of these metals. The metal reflector 10 is divided into an upper space and a lower space by the first stepped portion 12. The upper space is surrounded by an upper wall 13 extending vertically upward from the outer edge of the first stepped portion 12 and the lower space is surrounded by a lower wall 14 extending obliquely downward from the inner edge of the first stepped portion 12.

A second stepped portion 121 is connected to the overlying first stepped portion 12. More specifically, the second stepped portion 121 is formed along the boundary between the inner edge of the first stepped portion 12 and the upper end of the lower wall 14. The upper surface of the first stepped portion 12 and the upper surface of the second stepped portion 121 are preferably horizontal. The second stepped portion is optional and may be omitted.

The wavelength converting panel 20 includes a light transmitting lower glass plate 21a, a light transmitting upper glass plate 21b, and a wavelength converting sheet 22 sandwiched between the lower glass plate 21a and the upper glass plate 21b. The wavelength converting sheet 22 is preferably made by molding a mixture of QDs and a resin. QDs are particles that emit light at different wavelengths depending on their size or shape. Alternatively, the wavelength converting sheet 22 may be a phosphor sheet or any sheet including a different wavelength converting material.

The wavelength converting panel 20 is constructed by applying a first solid polymer between the upper surface of the lower glass plate 21a and the lower surface of the wavelength converting sheet 22 and between the lower surface of the upper glass plate 21b and the upper surface of the wavelength converting sheet 22 and melting the first solid polymer. In the wavelength converting panel 20, the lower glass plate 21a is integrated with the upper glass plate 21b through the wavelength converting sheet 22. The first solid polymer may be a glass molding material, an epoxy resin or a silicone resin.

The wavelength converting sheet 22 has an area smaller than the area of the lower glass plate 21a and the area of the upper glass plate 21b. With these dimensions, a recess 201 is formed along the edge of the wavelength converting panel 20. The recess 201 is depressed more inwardly than the side surface of the lower glass plate 21a and the side surface of the upper glass plate 21b.

The wavelength converting panel 20 is horizontally situated on the first stepped portion 12. Here, the edge of the lower surface of the wavelength converting panel 20 (more specifically the lower glass plate 21a) are in contact with the first stepped portion 12 and a gap exists between the side surface of the wavelength converting panel 20 and the upper wall 13 of the metal reflector 10.

Here, the side surface of the wavelength converting sheet 22 of the wavelength converting panel 20 faces the upper wall 13 of the metal reflector 10 through the gap. Another gap is formed between a portion of the lower surface of the wavelength converting panel 20 and the first stepped portion 12 by the second stepped portion 121 formed under the first stepped portion 12.

As mentioned earlier, the LED chip 30 is accommodated in the inner lower space of the reflector 10 that is open downward. The LED chip 30 is located below the wavelength converting panel 20. The LED chip 30 is integrated with the metal reflector 10 through the resin part 40 disposed in the inner lower space of the reflector 10 to cover the upper surface and the side surface of the LED chip 30. At least a portion of the resin part 40 may be a reflective wall formed by filling a mixture of amorphous spherical silica and a resin in the inner lower space of the metal reflector 10 and curing the mixture. The LED chip 30 may be one that emits light at a short wavelength. For example, the LED chip 30 may be a blue or UV LED chip. The LED chip 30 is preferably a flip-chip type LED chip having a pair of electrode pads with opposite polarities at the lower side thereof. The pair of electrode pads 31a and 31b are exposed to the outside through an opening formed at the lower end of the reflector 10. When the LED package is mounted on a PCB, the pair of electrode pads 31a and 31b are bonded to electrodes disposed on the PCB. The bottom surfaces of the pair of electrode pads 31a and 31b lie at the same level as the bottom surface of the metal reflector 10 and the bottom surface of the resin part 40. This arrangement prevents light emitted from the LED chip 30 from leaking through the bottom of the reflector 10 to the outside.

The QDs or phosphor particles present in the wavelength converting sheet 22 convert the wavelength of light emitted from the LED chip. The wavelength-converted light is emitted from the wavelength converting sheet 22. Preferably, the lower wall 14 of the reflector 10 has a downwardly tapered inner side surface. Due to this shape, the resin part 40 is prevented from easily escaping from the lower space.

The metal sealing member 60 is formed by filling a thermally conductive metal in the form of a liquid (or paste) or powder in the gap between the inner wall surface of the metal reflector 10 and the wavelength converting panel 20 supported by the first stepped portion 12 of the metal reflector 10 and solidifying the thermally conductive metal. The metal sealing member 60 is formed in contact with the side surfaces of the lower glass plate 21a and the upper glass plate 21b to fill the recess 201 formed along the edge of the wavelength converting panel 20 and close the edge of the wavelength converting panel 20. The metal sealing member 60 is formed in contact with the inner side surface of the upper wall 13 of the metal reflector 10. With this arrangement, heat transferred to the wavelength converting panel 20 can be released to the outside through the metal sealing member 60 and the metal reflector 10. A Pt paste can be advantageously used as a material for the formation of the metal sealing member 60. Alternatively, a metal such as nickel, chromium, silver, aluminum, gold, copper, zinc, tin, platinum or lead, or a metal material including at least one of these metals may be used to form the metal sealing member 60.

The metal sealing member 60 includes an underfill 62 filling the second stepped portion 121 formed at the boundary between the inner edge of the first stepped portion 12 and the upper end of the lower wall 14. The underfill 62 further improves the heat dissipation performance of the wavelength converting panel 20 and ensures improved bonding of the wavelength converting panel 20 to the reflector 10.

As described above, the metal sealing member 60 closes the edge of the wavelength converting panel 20 to fill the gap between the lower glass plate 21a and the upper glass plate 21b and thermally connects the wavelength converting panel 20 to the metal reflector 10. Thus, the metal sealing member 60 protects the wavelength converting material (for example, one including QDs) present in the wavelength converting panel 20 from thermal damage and can reduce the water vapor transmission rate (WVTR) of the wavelength converting panel to a zero value. In addition, the metal reflector 10 and the reflective resin part 40 can greatly increase the light extraction efficiency of the LED package due to their high reflectivity.

Figure 4:
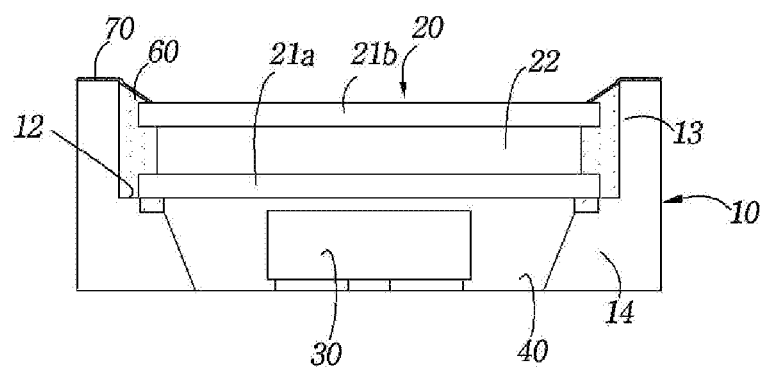
FIG. 4 is a cross-sectional view illustrating an LED package according to a further embodiment of the present invention.

FIG. 4 illustrates an LED package according to a further embodiment of the present invention.

Referring to FIG. 4, the LED package includes a metal reflector 10 having a ring-shaped first stepped portion 12 formed in the middle of the height of the inner wall surface thereof along the inner wall surface, a wavelength converting panel 20 arranged in an inner upper space of the reflector 10 to be supported by the first stepped portion 12, an LED chip 30 accommodated in an inner lower space of the reflector 10 and located below the wavelength converting panel 20, a resin part 40 disposed in the inner lower space of the reflector 10 to cover the side surface of the LED chip 30, and a metal plating layer 70 covering both the metal reflector 10 and the metal sealing member 60 to integrate the metal reflector 10 with the metal sealing member 60.

Both the metal reflector 10 and the metal sealing member 60 are made of metals that can be readily plated, facilitating the formation of the metal plating layer 70 thereon. The formation of the metal plating layer 70 covering both the metal reflector 10 and the metal sealing member 60 enables integral bonding between the metal reflector 10 and the metal sealing member 60 in a more reliable manner.

Figure 5:
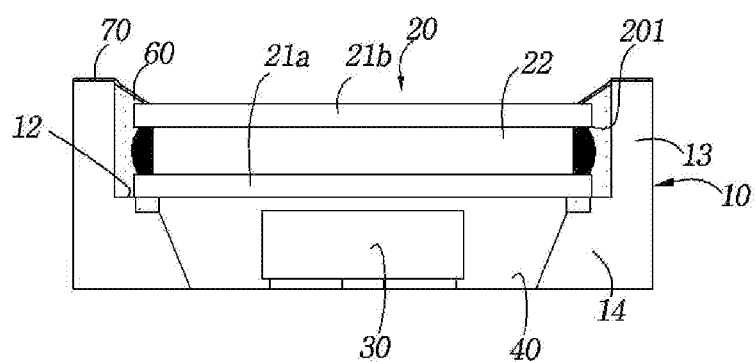
FIG. 5 is a cross-sectional view illustrating an LED package according to another embodiment of the present invention.

FIG. 5 illustrates an LED package according to another embodiment of the present invention.

In this embodiment, a wavelength converting panel 20 of the LED package includes a light transmitting lower glass plate 21a, a light transmitting upper glass plate 21b, and a wavelength converting sheet 22 sandwiched between the lower glass plate 21a and the upper glass plate 21b, as in the foregoing embodiments. The wavelength converting sheet 22 has an area smaller than the area of the lower glass plate 21a and the area of the upper glass plate 21b. With these dimensions, a recess 201 is formed along the edge of the wavelength converting panel 20. The recess 201 is depressed more inwardly than the side surface of the lower glass plate 21a and the side surface of the upper glass plate 21b.

A first solid polymer is applied between the upper surface of the lower glass plate 21a and the lower surface of the wavelength converting sheet 22 and between the lower surface of the upper glass plate 21b and the upper surface of the wavelength converting sheet 22 and is then melted. As a result, the lower glass plate 21a is integrated with the upper glass plate 21b through the wavelength converting sheet 22. A lateral sealing member 80 is arranged to face the side surface of the wavelength converting sheet 22. The lateral sealing member 80 is formed by pre-filling a second solid polymer in the recess 201 and melting and curing the polymer. The lateral sealing member 80 facing the side surface of the wavelength converting sheet 22 in the recess 201 is located between a metal sealing member 60 and the side surface of the wavelength converting sheet 22, contributing to preventing heat transferred to the metal sealing member 60 from returning to the wavelength converting sheet 22.

What is claimed is:

1. An LED package comprising:
    a reflector having a cavity formed therein;
    an LED chip arranged in a lower space of the cavity of the reflector;
    a wavelength converting panel comprising a lower glass plate, an upper glass plate, and a wavelength converting sheet interposed between the lower glass plate and the upper glass plate and arranged in an upper space of the cavity of the reflector; and
    a sealing member for heat transfer disposed on a side surface of the lower glass plate and a side surface of the upper glass plate and connecting the wavelength converting panel to the reflector,
    wherein an inner wall surface of the reflector comprises a first stepped portion on which the wavelength converting panel is seated and a second stepped portion connected to the overlying first stepped portion and filled with the sealing member for heat transfer, the LED chip is disposed in the lower space of the reflector and is integrated with the reflector by a composite of amorphous spherical silica and a resin formed in the lower space of the reflector, and the LED chip comprises a pair of electrode pads exposed downward through an opening formed at a lower end of the reflector, and
    wherein the wavelength converting panel comprises a recess formed along a side surface of the wavelength converting sheet and depressed more inwardly than the side surface of the lower glass plate and the side surface of the upper glass plate, and a portion of the sealing member for heat transfer is filled in the recess.

2. The LED package according to claim 1, wherein the sealing member for heat transfer is formed by filling a thermally conductive metal in the form of a powder, liquid or gel in a gap between the inner wall surface of the reflector and the wavelength converting panel and solidifying the thermally conductive metal.

3. The LED package according to claim 1, wherein the composite is formed by filling a mixture of amorphous spherical silica and a resin into the lower space of the reflector and curing the mixture.

4. The LED package according to claim 1, wherein a lower wall of the reflector has a downwardly tapered inner side surface.

5. The LED package according to claim 1, wherein the wavelength converting material present in the wavelength converting sheet comprises quantum dots (QDs).

6. The LED package according to claim 1, wherein the sealing member for heat transfer is formed by filling a metal in the form of a liquid, gel or powder in a gap formed between a side surface of the wavelength converting panel and an inner side surface of an upper wall of the reflector when the wavelength converting panel is horizontally arranged in the middle of the height of the reflector, and solidifying the metal.

7. An LED package comprising:
a reflector having a cavity formed therein;
an LED chip arranged in a lower space of the cavity of the reflector;
a wavelength converting panel comprising a lower glass plate, an upper glass plate, and a wavelength converting sheet interposed between the lower glass plate and the upper glass plate and arranged in an upper space of the cavity of the reflector; and
a sealing member for heat transfer disposed on a side surface of the lower glass plate and a side surface of the upper glass plate and connecting the wavelength converting panel to the reflector,
wherein an inner wall surface of the reflector comprises a first stepped portion on which the wavelength converting panel is seated and a second stepped portion connected to the overlying first stepped portion and filled with the sealing member for heat transfer, the LED chip is disposed in the lower space of the reflector and is integrated with the reflector by a composite of amorphous spherical silica and a resin formed in the lower space of the reflector, and the LED chip comprises a pair of electrode pads exposed downward through an opening formed at a lower end of the reflector, and
wherein the sealing member for heat transfer is made of a metal or metallic material.

8. The LED package according to claim 7, wherein the sealing member for heat transfer is formed by filling a thermally conductive metal in the form of a powder, liquid or gel in a gap between the inner wall surface of the reflector and the wavelength converting panel and solidifying the thermally conductive metal.

9. The LED package according to claim 7, wherein the wavelength converting panel further comprises a recess formed along a side surface of the wavelength converting sheet and depressed more inwardly than the side surface of the lower glass plate and the side surface of the upper glass plate and a lateral sealing member located between the side surface of the wavelength converting sheet and the sealing member for heat transfer in the recess.

10. The LED package according to claim 7, wherein the composite is formed by filling a mixture of amorphous spherical silica and a resin into the lower space of the reflector and curing the mixture.

11. The LED package according to claim 7, wherein a lower wall of the reflector has a downwardly tapered inner side surface.

12. The LED package according to claim 7, wherein the wavelength converting material present in the wavelength converting sheet comprises quantum dots.

13. The LED package according to claim 7, wherein the sealing member for heat transfer is formed by filling a metal in the form of a liquid, gel or powder in a gap formed between a side surface of the wavelength converting panel and an inner side surface of an upper wall of the reflector when the wavelength converting panel is horizontally arranged in the middle of the height of the reflector, and solidifying the metal.

14. An LED package comprising:
a reflector having a cavity formed therein;
an LED chip arranged in a lower space of the cavity of the reflector; a wavelength converting panel comprising a lower glass plate, an upper glass plate, and a wavelength converting sheet interposed between the lower glass plate and the upper glass plate and arranged in an upper space of the cavity of the reflector;
a sealing member for heat transfer disposed on a side surface of the lower glass plate and a side surface of the upper glass plate and connecting the wavelength converting panel to the reflector; and
a plating layer covering the reflector and the sealing member for heat transfer to integrate the reflector with the sealing member for heat transfer,
wherein an inner wall surface of the reflector comprises a first stepped portion on which the wavelength converting panel is seated and a second stepped portion connected to the overlying first stepped portion and filled with the sealing member for heat transfer, the LED chip is disposed in the lower space of the reflector and is integrated with the reflector by a composite of amorphous spherical silica and a resin formed in the lower space of the reflector, and the LED chip comprises a pair of electrode pads exposed downward through an opening formed at a lower end of the reflector.

15. The LED package according to claim 14, wherein the sealing member for heat transfer is formed by filling a thermally conductive metal in the form of a powder, liquid or gel in a gap between the inner wall surface of the reflector and the wavelength converting panel and solidifying the thermally conductive metal.

16. The LED package according to claim 14, wherein the wavelength converting panel further comprises a recess formed along a side surface of the wavelength converting sheet and depressed more inwardly than the side surface of the lower glass plate and the side surface of the upper glass plate and a lateral sealing member located between the side surface of the wavelength converting sheet and the sealing member for heat transfer in the recess.

17. The LED package according to claim 14, wherein the composite is formed by filling a mixture of amorphous spherical silica and a resin into the lower space of the reflector and curing the mixture.

18. The LED package according to claim 14, wherein a lower wall of the reflector has a downwardly tapered inner side surface.

19. The LED package according to claim 14, wherein the wavelength converting material present in the wavelength converting sheet comprises quantum dots.

20. The LED package according to claim 14, wherein the sealing member for heat transfer is formed by filling a metal in the form of a liquid, gel or powder in a gap formed between a side surface of the wavelength converting panel and an inner side surface of an upper wall of the reflector when the wavelength converting panel is horizontally arranged in the middle of the height of the reflector, and solidifying the metal.

* * * * *